(12) United States Patent
Kanemoto

(10) Patent No.: US 7,524,705 B2
(45) Date of Patent: Apr. 28, 2009

(54) METHOD FOR MANUFACTURING A SEMICONDUCTOR SUBSTRATE AND METHOD FOR MANUFACTURING A SEMICONDUCTOR DEVICE

(75) Inventor: Kei Kanemoto, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 79 days.

(21) Appl. No.: 11/494,121

(22) Filed: Jul. 26, 2006

(65) Prior Publication Data

US 2007/0026582 A1 Feb. 1, 2007

(30) Foreign Application Priority Data

Jul. 27, 2005 (JP) .............. 2005-216873

(51) Int. Cl.
*H01L 21/00* (2006.01)
(52) U.S. Cl. .............. 438/149; 438/745; 257/E21.224; 257/E21.561; 257/E21.703
(58) Field of Classification Search ................ 438/149, 438/745; 257/E21.224, E21.561, E21.703
See application file for complete search history.

(56) References Cited

U.S. PATENT DOCUMENTS

| 6,727,550 | B2* | 4/2004 | Tezuka et al. ............... 257/347 |
| 7,271,447 | B2* | 9/2007 | Takizawa et al. ........... 257/349 |
| 2005/0124167 | A1 | 6/2005 | Nevin et al. |
| 2006/0102204 | A1* | 5/2006 | Jacobson et al. ............. 134/26 |
| 2007/0001165 | A1* | 1/2007 | Ranica et al. ................ 257/19 |
| 2007/0020828 | A1* | 1/2007 | Hara ........................... 438/164 |
| 2007/0063263 | A1* | 3/2007 | Oh et al. ..................... 257/316 |
| 2007/0102761 | A1* | 5/2007 | Inaba et al. ................. 257/347 |

OTHER PUBLICATIONS

Sakai, et al., "Separation by Bonding Si Islands (SBSI) for LSI Applications," Second International SiGe Technology and Device Meeting Abstract, SBSI Technology, pp. 230-231 (2004).
Yamazaki et al., *Separation by Bonding Si Islands (SBSI) for Advanced CMOS LSI Applications*, IEICE Trans. Electron. vol. E88-C, No. 4, Apr. 2005, p. 656-657.
ULSI Technology, 1996, McGraw-Hill Int'l Editions, ISBN No. 0-07-114105-7.

* cited by examiner

*Primary Examiner*—Charles D. Garber
*Assistant Examiner*—Stanetta D Isaac
(74) *Attorney, Agent, or Firm*—Edwards Angell Palmer & Dodge LLP; John J. Penny, Jr.

(57) ABSTRACT

A method for manufacturing a semiconductor substrate includes forming a first semiconductor layer on a predetermined region of a semiconductor base, forming a second semiconductor layer whose etching selective ratio is smaller than that of the first semiconductor layer on the first semiconductor layer, forming a support member to support the second semiconductor layer on the semiconductor base so as to cover the second semiconductor layer, forming an opening face in the support member to expose a portion of an edge of the first semiconductor layer, etching the first semiconductor layer through the opening face so as to form a cavity between the second semiconductor layer and the semiconductor base, cleaning between the second semiconductor layer and the semiconductor base through the opening face in a condition to remove a residue of the first semiconductor layer, and forming an insulating film in the cavity after cleaned.

4 Claims, 9 Drawing Sheets

A: SPM, DHF
B: SPM, DHF, APM, HPM, DHF

| CLEANING CONDITION | H2SO4 (97%) | H2O2 (31%) | HF (50%) | NH4OH | HC1 (36%) | H2O | temp |
|---|---|---|---|---|---|---|---|
| APM | | 4 | | 1 | | 50 | 60°C |
| HPM | | 1 | | | 1 | 50 | 60°C |
| FPM | | 1 | 1 | | | 200 | 60°C |
| SPM | 4 | 1 | | | | | 120°C |
| DHF | | | 1 | | | 200 | RT |

METHOD FOR MANUFACTURING A SEMICONDUCTOR SUBSTRATE AND METHOD FOR MANUFACTURING A SEMICONDUCTOR DEVICE

BACKGROUND

1. Technical Field

The present invention relates to a method for manufacturing a semiconductor substrate and a method for manufacturing a semiconductor device. In particular, the invention relates to a technology to form a silicon-on-insulator (SOI) structure on a semiconductor substrate.

2. Related Art

Currently, development of SOI technology is carried out actively in the field of semiconductor manufacturing in order to provide integrated circuits with lower power consumption. Devices using an SOI substrate are known for providing characteristics allowing higher speed than those of devices in related art and low power consumption. This is because the devices can greatly reduce parasitic capacitance of transistors.

On the other hand, cost of the substrate is very high since special equipment is required in SIMOX method, a bonding method and so on for manufacturing the SOI substrate. The cost is normally 5 to 10 times more than that of a bulk substrate. Further, devices using the SOI structure have some disadvantages such as reduction of drain breakdown voltage and electrostatic discharge immunity level due to the special structure. In order to solve these problems, methods to form the SOI structure partially on a bulk substrate have been proposed.

One of the methods proposed as above is, as disclosed in *Separation by Bonding Si islands (SBSI) for LSI Applications*. (T. Sakai et al.), Second International SiGe Technology and Device Meeting Abstract, pp. 230-231, May (2004), SBSI technology. The SBSI technology is applicable to an existing production line for semiconductors in related art. Besides, the technology provides an SOI device that can economically provide high performance by forming the SOI structure exclusively in a region required on a bulk substrate.

Now the details of the manufacturing method will be addressed. First of all, a silicon germanium (SiGe) layer and a silicon (Si) layer are formed on a Si substrate by epitaxial growth. Next, a hollow portion for a support member is formed in the Si layer and the SiGe layer. After a silicon oxide ($SiO_2$) film or a silicon nitride ($Si_3N_4$) film is formed as the support member, the support member is dry etched to form a shape of an element region. Sequentially, the Si layer and the SiGe layer are also dry etched. When the SiGe layer is selectively etched with hydrofluoric-nitric acid in this state, a cavity is formed under the Si layer hanging on to the support member. Thereafter, the cavity is embedded with a $SiO_2$ film by thermal oxidation so as to complete an SOI structure.

In the method using the SBSI technology above, it is confirmed that a Ge residue remains on the surface of the Si film after the SiGe layer is selectively etched. Then, when the Si substrate is oxidized after the SiGe layer is selectively etched, Ge in the $SiO_2$ film tends to gather at an interface between the $SiO_2$ film and the Si film (hereinafter, referred to as the $SiO_2$/Si interface) moving as if extruded from the inside of the $SiO_2$ film to the Si side.

The inventor of the present invention focused attention to such concentration of Ge at the $SiO_2$/Si interface and performed various experiments. From the results of the experiments, the inventor has uncovered the fact that device characteristics are easily deteriorated when a Si substrate is thermally oxidized with a Ge residue remaining in its cavity.

The results of the experiments are shown in FIGS. 7 through 10. The experiments used wafers in which Ge was adsorbed intentionally (hereinafter referred to as Ge adsorbed wafers) as samples in substitution for Si substrates with a Ge residue.

FIG. 7 is a chart showing amounts of Ge adsorption on the surface of the wafers v. the flow time of $GeH_4$ gas with an epitaxial chemical vapor deposition (CVD) reactor. The horizontal axis in FIG. 7 shows the flow time of $GeH_4$ gas (time for supply) by the epitaxial reactor in which the wafers are loaded. The vertical axis shows amounts of Ge adsorption (Ge density) on the surface of the wafers. In this experiment, the wafers were silicon, and two different degrees of temperature such as 400 and 450 degrees centigrade were set. As shown in FIG. 7, with the epitaxial reactor, the longer the $GeH_4$ gas was flowed and also the higher the temperature of the wafer was, the more Ge adsorbed to the surface.

FIG. 8 is a chart showing the thickness of a $SiO_2$ film against Ge density of the sample wafers. The $SiO_2$ film was formed on the sample wafers by treating Ge adsorbed wafers at 1000 degrees centigrade with $O_2$ for one hour. The horizontal axis in FIG. 8 shows amounts of Ge adsorption (Ge density) on the surface of the wafers. The vertical axis shows the thickness of the $SiO_2$ film formed on the surface of the wafers by the treatment above. The dotted line in FIG. 8 shows the thickness of the $SiO_2$ film formed on the surface of a Ge non-adsorbed wafer as a reference. As shown in FIG. 8, $SiO_2$ was formed thicker when Ge adsorbed to the surface of the wafer, and the thickness of the $SiO_2$ film formed increased as Ge density grew.

The result shows that a large Ge residue adsorbed onto the cavity remaining after the selective etching of the SiGe layer makes the $SiO_2$ film thicker than the target. Accordingly, the SOI body may become thinner for the extent of the excessive thickness of the $SiO_2$ film.

FIG. 9 is a chart showing a lifetime of the Si surface against Ge density of sample wafers. The $SiO_2$ film was formed on the sample wafers by treating Ge adsorbed wafers at 1000 degrees centigrade with $O_2$ for one hour. The horizontal axis in FIG. 9 shows amounts of Ge adsorption (Ge density) on the surface of the wafers. The vertical axis shows the lifetime of the Si surface after the treatment above. The dotted line in FIG. 9 shows the lifetime of a Si surface of a Ge non-adsorbed wafer as a reference after the treatment above. As shown in FIG. 9, the lifetime of the Si surface increased (i.e. defects increased) as the Ge density on the surface of the wafer went over $10^{13}$ $cm^2$.

FIG. 10 is a chart showing a $SiO_2$/Si interface state density against Ge density of sample wafers. The $SiO_2$ film was formed on the sample wafers by treating Ge adsorbed wafers at 1000 degrees centigrade with $O_2$ for one hour. The horizontal axis in FIG. 10 shows amounts of Ge adsorption (Ge density) on the surface of the wafers. The vertical axis shows the $SiO_2$/Si interface state density after the treatment above. As shown in FIG. 10, the $SiO_2$/Si interface state density increased as the Ge density on the surface of the wafer went over $10^{13}$ $cm^{-2}$.

As shown in FIGS. 9 and 10, there is a risk that device characteristics are deteriorated if values of the lifetime and the interface state density are high. For example, an increase of leakage current, deterioration of mobility, an increase of noise and a decrease of insulating breakdown voltage may occur.

SUMMARY

An advantage of the invention is to provide a method for manufacturing a semiconductor substrate and a method for manufacturing a semiconductor device so as to prevent deterioration of device characteristics caused by a residue in a cavity.

According to a first aspect of the invention, a method for manufacturing a semiconductor substrate includes forming a first semiconductor layer on a predetermined region of a semiconductor base, forming a second semiconductor layer whose etching selective ratio is smaller than that of the first semiconductor layer on the first semiconductor layer, forming a support member to support the second semiconductor layer on the semiconductor base so as to cover the second semiconductor layer, forming an opening face in the support member to expose a portion of an edge of the first semiconductor layer, etching the first semiconductor layer through the opening face so as to form a cavity between the second semiconductor layer and the semiconductor base, cleaning between the second semiconductor layer and the semiconductor base material through the opening face in a condition to remove a residue of the first semiconductor layer, and forming an insulating film in the cavity after cleaned.

The semiconductor base here is, for example, a bulk Si substrate. The predetermined region is, for example, a region to form elements such as a transistor (i.e. an element-forming region). The first semiconductor layer is, for example, a SiGe layer gained by epitaxial growth, while the second semiconductor layer is, for example, a Si layer gained by epitaxial growth. For etching SiGe, hydrofluoric-nitric acid is used, for example. In the step of forming an insulating film in the cavity, a thermal oxide film is formed in the cavity by oxidizing the post-cleaned semiconductor base by thermal treatment.

According to the method for manufacturing a semiconductor substrate in the first aspect of the invention, the insulating film is formed in the cavity after a residue of the first semiconductor layer is removed from the cavity. Therefore, deterioration of device characteristics due to the residue of the first semiconductor layer can be prevented.

According to a second aspect of the invention, a method for manufacturing a semiconductor substrate includes forming a first semiconductor layer on a semiconductor base, forming a second semiconductor layer whose etching selective ratio is smaller than that of the first semiconductor layer on the first semiconductor layer, forming a hollow portion in the second semiconductor layer and the first semiconductor layer to expose the semiconductor base, forming a support member to support the second semiconductor layer on the semiconductor base so as to embed the hollow portion and cover the second semiconductor layer, forming an opening face in the support member to expose a portion of an edge of the first semiconductor layer, etching the first semiconductor layer through the opening face so as to form a cavity between the second semiconductor layer and the semiconductor base, cleaning between the second semiconductor layer and the semiconductor base through the opening face in a condition to remove a residue of the first semiconductor layer, and forming an insulating film in the cavity after cleaned. The hollow portion here is formed in an isolation region, for example.

According to the method for manufacturing a semiconductor substrate in the second aspect of the invention, the insulating film is formed in the cavity after a residue of the first semiconductor layer is removed from the cavity. Therefore, deterioration of device characteristics due to the residue of the first semiconductor layer can be prevented.

In the method for manufacturing a semiconductor substrate in the first or second aspect of the invention, the first semiconductor layer may be made of SiGe, and a cleaning solution used in cleaning between the second semiconductor layer and the semiconductor base may include an aqueous ammonia solution and a hydrogen peroxide solution.

With this structure, the Ge residue in the cavity can be reduced. Thus deterioration of device characteristics due to the Ge residue can be prevented.

In this case, the cleaning solution including the aqueous ammonia solution and the hydrogen peroxide solution may be an APM cleaning solution, and cleaning treatment using the APM cleaning solution and cleaning treatment using any one of an HPM cleaning solution, an FPM cleaning solution, an SPM cleaning solution, and a DHF cleaning solution may be combined to clean between the second semiconductor layer and the semiconductor base.

The APM cleaning solution here is a cleaning solution made of $NH_4OH$, $H_2O_2$, and $H_2O$. The HPM cleaning solution is a cleaning solution made of HCl, $H_2O_2$, and $H_2O$. The FPM cleaning solution is a cleaning solution made by diluting $H_2O_2$ and HF with $H_2O$. The SPM cleaning solution is a cleaning solution made of $H_2SO_4$ and $H_2O_2$. Further, the DHF cleaning solution is a cleaning solution made by diluting HF with $H_2O$.

In this case, as shown in FIG. 5 for example, the Ge residue can be removed more effectively.

The method for manufacturing a semiconductor substrate in one of the first to the fourth aspects of the invention may further include planarizing the whole upper surface of the semiconductor base to remove the support member on the second semiconductor layer after the insulating film is formed in the cavity.

With this structure, the surface of the second semiconductor layer is exposed from under the support member and elements such as a transistor can be formed on the second semiconductor layer.

In this case, the method for manufacturing a semiconductor substrate may further include forming a transistor on the second semiconductor layer after the support member on the second semiconductor layer is removed.

With this structure, the method for manufacturing a semiconductor substrate above is applied, and thus a semiconductor device that has good device characteristics can be provided.

The invention is suitable as it is applied to the SBSI technology to form an SOI structure exclusively in a region required on a bulk semiconductor substrate.

BRIEF DESCRIPTION OF THE DRAWINGS

The invention will be described with reference to the accompanying drawings, wherein like numbers reference like elements.

DESCRIPTION OF EXEMPLARY EMBODIMENTS

An embodiment of the present invention will now be described with reference to the accompanying drawings.

Figure 1A:
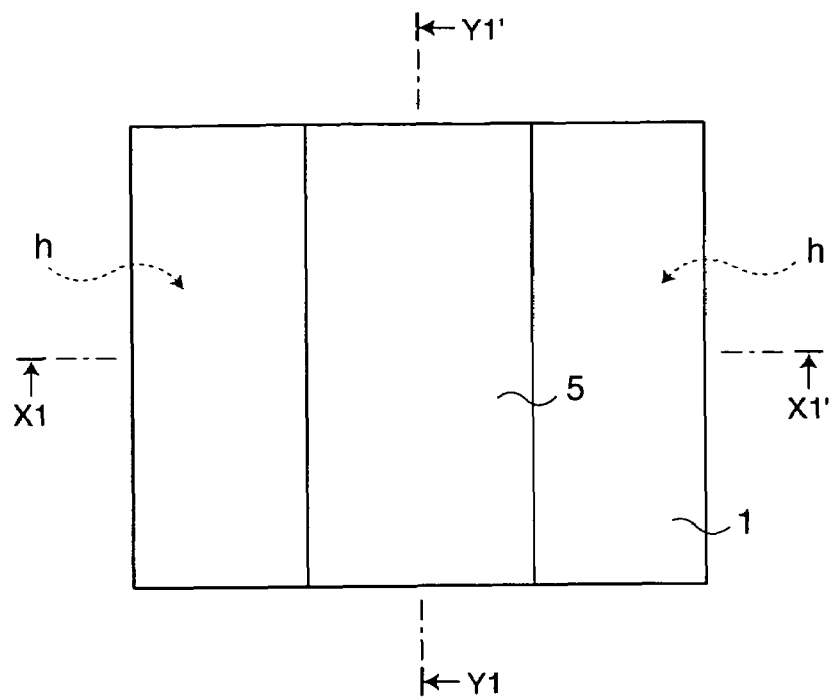
FIGS. 1A, 1B and 1C are diagrams illustrating a method for manufacturing a semiconductor device according to an embodiment of the invention.
Figure 1B:
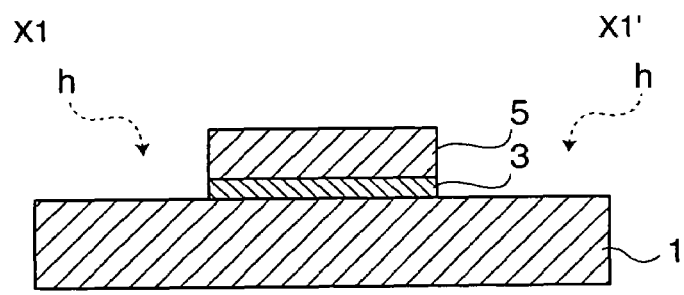
Figure 1C:
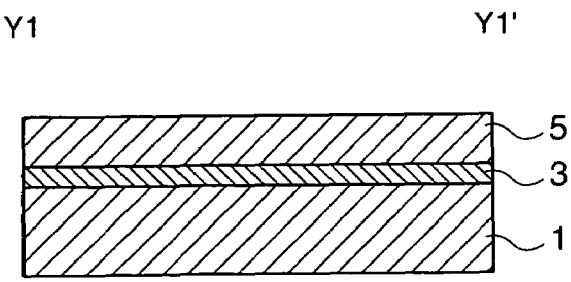
Figure 2A:
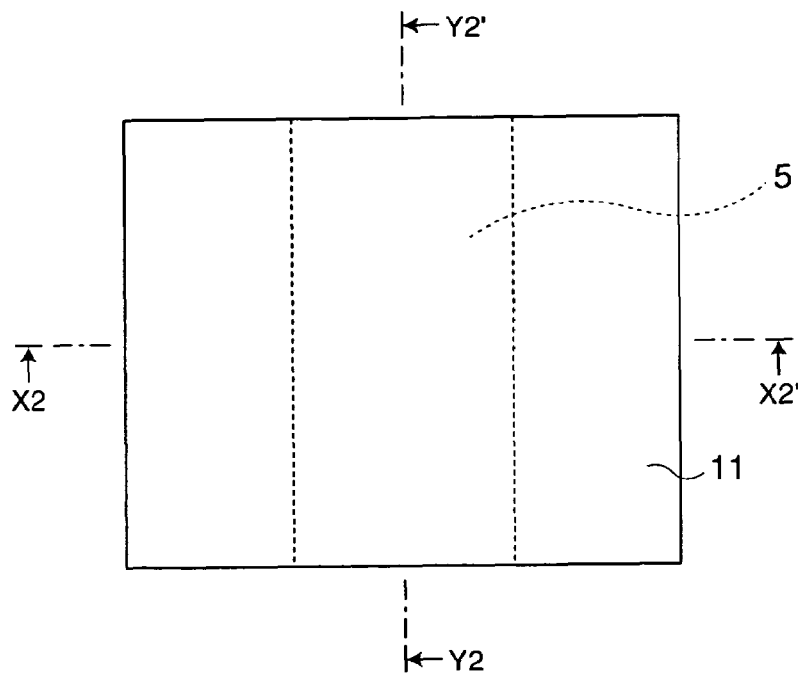
FIGS. 2A, 2B and 2C are diagrams illustrating the method for manufacturing a semiconductor device according to the embodiment of the invention.
Figure 2B:
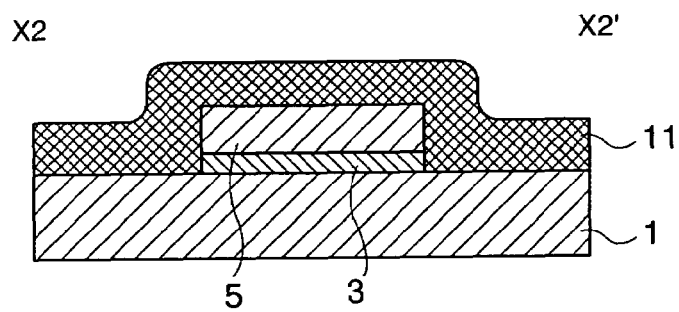
Figure 2C:
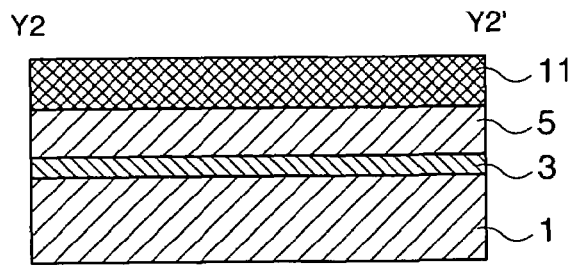
Figure 3A:
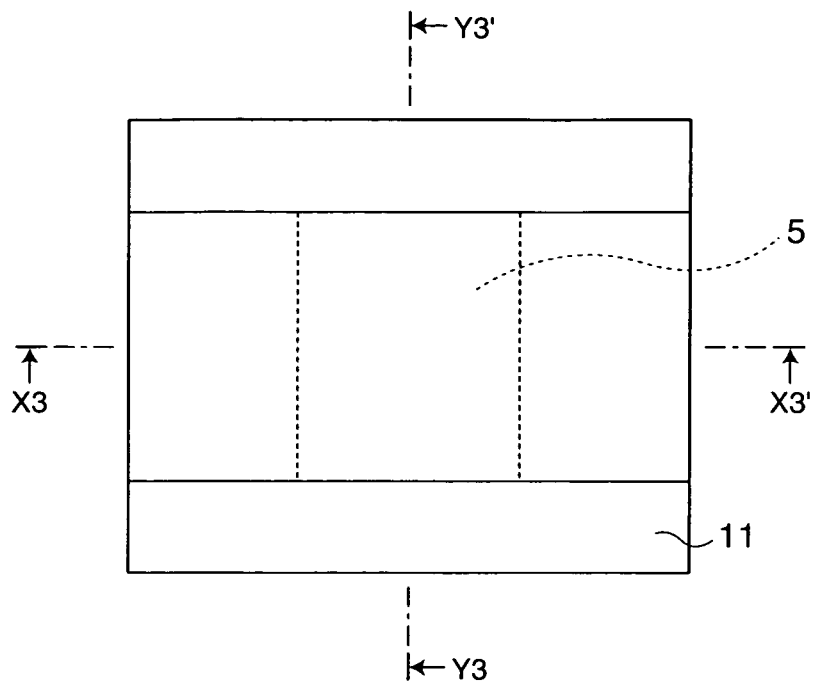
FIGS. 3A, 3B and 3C are diagrams illustrating the method for manufacturing a semiconductor device according to the embodiment of the invention.
Figure 3B:
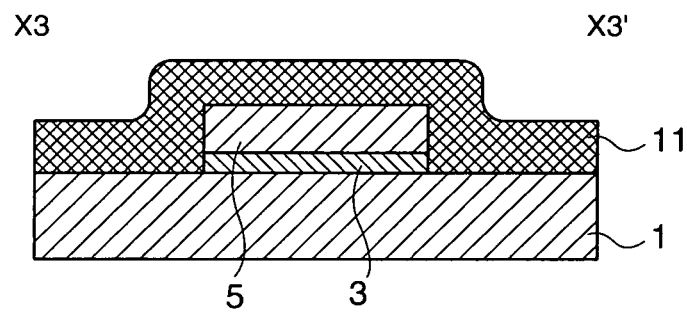
Figure 3C:
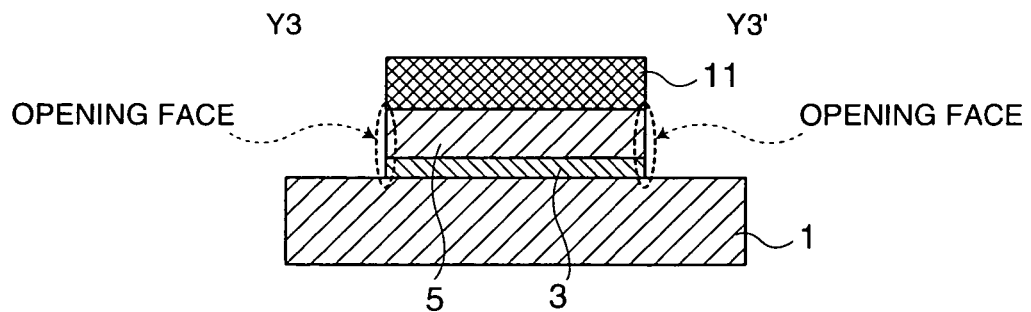
Figure 4A:
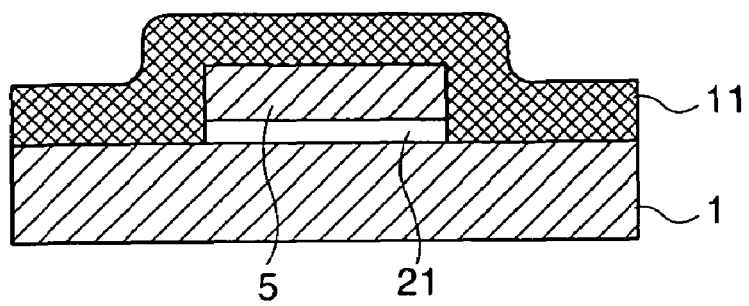
FIGS. 4A, 4B and 4C are diagrams illustrating the method for manufacturing a semiconductor device according to the embodiment of the invention.
Figure 4B:
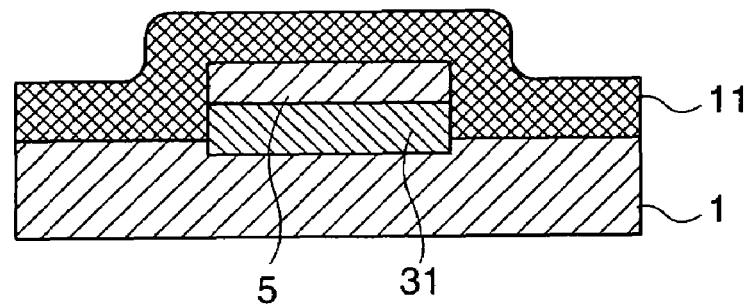
Figure 4C:
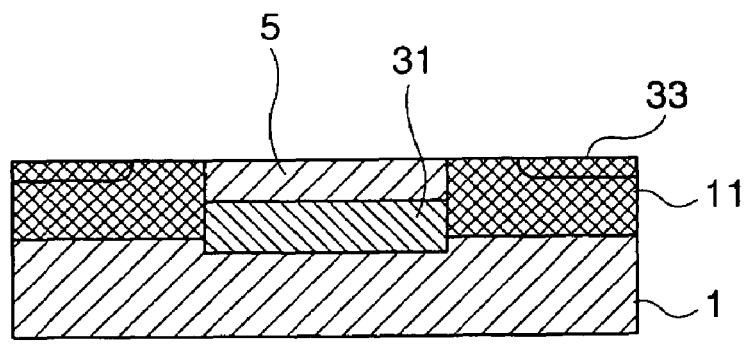

FIGS. 1A, 2A and 3A are plan views showing a method for manufacturing a semiconductor device according to an embodiment of the invention. FIG. 1B is a sectional view taken along the line X1-X1' of FIG. 1A. FIG. 1C is a sectional view taken along the line Y1-Y1' of FIG. 1A. FIG. 2B is a sectional view taken along the line X2-X2' of FIG. 2A. FIG. 2C is a sectional view taken along the line Y2-Y2' of FIG. 2A. FIG. 3B is a sectional view taken along the line X3-X3' of FIG. 3A. FIG. 3C is a sectional view taken along the line Y3-Y3' of FIG. 3A. Further, FIGS. 4A, 4B and 4C are sectional views taken along the line X3-X3' showing the method for manufacturing a semiconductor device after the step shown in FIG. 3B.

As shown in FIGS. 1A through 1C, a SiGe layer 3 is formed on a Si substrate 1 that is a bulk silicon wafer, and a Si layer 5 is formed on the top thereof. The SiGe layer 3 and the Si layer 5 are formed by epitaxial growth.

Next, hollow portions h for a support member are formed. That is to say, as shown in FIGS. 1A through 1C, the Si layer 5 and the SiGe layer 3 are patterned sequentially by photolithography and etching technique so as to expose portions of the surface of the Si substrate 1. These exposed portions are the hollow portions h for the support member. The hollow portions h are formed in a part outside of a region to form an element such as a transistor (i.e. an isolation region). To expose the portions of the Si substrate 1, the etching treatment can be performed until reaching the surface of the Si substrate 1, or the Si substrate 1 can be overetched so as to form a concave portion in the Si substrate 1.

Then, as shown in FIGS. 2A through 2C, a $SiO_2$ film 11 is formed on the whole upper surface of the Si substrate 1 by chemical vapor deposition (CVD), for example. As shown in FIG. 2B, the $SiO_2$ film 11 is formed on the sides of the SiGe layer 3 and the Si layer 5 as well as in the hollow portions h for the support member and on the Si layer 5. In this method for manufacturing a semiconductor device, the $SiO_2$ film 11 is the support member. Therefore, the Si layer 5 is supported by the $SiO_2$ film 11 on the Si substrate 1.

Next, as shown in FIGS. 3A through 3C, the $SiO_2$ film 11, the Si layer 5, and the SiGe layer 3 are patterned sequentially by photolithography and etching technique so as to form opening faces in the $SiO_2$ film 11 to expose portions of the sides of the SiGe layer 3 and portions of the sides (the edges) of the Si layer 5. The Si layer 5 and the SiGe layer 3 are completely removed from the Si substrate 1 in the isolation region, and remain simply on a region to form an element such as a transistor (i.e. an element-forming region) on the Si substrate 1.

As shown in FIGS. 3A through 3C, the opening faces to expose portions of the sides of the SiGe layer 3 and so on are formed along a part of the peripheral border of the element-forming region. At the portions of the $SiO_2$ film 11 having no opening faces, the sides of the $SiO_2$ film 11 come in contact with the sides of the SiGe layer 3 and the sides of the Si layer 5 even after the opening faces are formed. The $SiO_2$ film 11 keeps supporting the Si layer 5 at the contact portions.

Then, the SiGe layer 3 is etched and removed by bringing an etchant such as hydrofluoric-nitric acid through the opening faces formed in the $SiO_2$ film 11 into contact with the SiGe layer 3 and the Si layer 5. Thus a cavity 21 is formed between the Si substrate 1 and the Si layer 5 as shown in FIG. 4A. For wet etching using hydrofluoric-nitric acid, an etching selective ratio of SiGe to Si is about 100:1, for example. Therefore, the SiGe layer 3 can be removed exclusively and selectively without etching the Si layer 5 so much.

Ge tends to remain in the cavity 21 as a residue by the above-mentioned etching with hydrofluoric-nitric acid. This kind of Ge residue can be removed by etching the SiGe layer 3 excessively with hydrofluoric-nitric acid (i.e. overetching the layer longer than necessary). In this case, however, there are adverse effects such as that the Si layer 5 and the $SiO_2$ film 11 are also overetched unduly.

Therefore, in this embodiment, for example, cleaning treatment is performed to the Si substrate 1 in a wet station to remove the Ge residue after the cavity 21 is formed between the Si substrate 1 and the Si layer 5. In this cleaning process, a cleaning solution (i.e. an APM cleaning solution) made of $H_2O_2$, $NH_4OH$, and $H_2O$ is used, for example. Examples of the mixing ratio and the temperature of the APM cleaning solution will be shown later referring to FIG. 6.

Cleaning inside of the cavity 21 through the opening faces by performing the APM cleaning to the Si substrate 1 can prevent the adverse effects such as an excessive etching of the Si layer 5 and the SiO2 film 11 while removing the Ge residue from the cavity 21 exclusively and successively.

As shown in FIG. 4A, even after the SiGe layer 3 is removed and the cavity 21 is formed, the sides of the Si layer 5 having no opening faces remain covered with the $SiO_2$ film 11. Therefore the Si layer 5 is supported by the covered portion on the Si substrate 1 and is maintained.

Then, the Si substrate 1 is thermally oxidized. At this time, oxidizing species such as $O_2$ reach inside of the cavity 21 through the opening faces as well as the surface of the Si substrate 1 that is exposed from underneath of the $SiO_2$ film 11. Accordingly, as shown in FIG. 4B, a $SiO_2$ film 31 is also formed in the cavity 21. Hereinafter, the $SiO_2$ film 31 formed in the cavity 21 is referred to as an buried oxide film. In the case of insufficient embedding of the buried oxide film 31 into the cavity 21, a $SiO_2$ film or the like can be deposited in the cavity 21 by CVD, for example, after thermal oxidation. Alternatively, high-temperature annealing can be performed at 1000 degrees centigrade or more after the buried oxide film 31 is formed in the cavity 21. Thereby the buried oxide film 31 can be reflowed.

Next, as shown in FIG. 4C, an insulating film 33 for isolation is formed on the whole upper surface of the Si substrate 1 by CVD or the like. The insulating film 33 is a $SiO_2$ film, for example. Then, the whole upper surface of the substrate 1 is planarized by chemical mechanical polishing (CMP) so as to remove the insulating film 33 and the $SiO_2$ film 11 from the top of the Si layer 5. Accordingly, the top surface of the Si layer 5 is exposed, and a structure in which isolation of the Si layer 5 is achieved by the insulating film (i.e. SOI structure) is now completed on the bulk Si substrate 1.

Thereafter, a gate insulating film (not shown) is formed on the surface of the Si layer 5 by thermal oxidation of the surface of the Si layer 5, for example. Then, a gate electrode (not shown) is formed on the Si layer 5 on which the gate insulating film is formed. Further, a source and a drain (not shown) are formed by implantation of impurity ions such as As, P, and B into the Si layer 5 using the gate electrode, for example, as a mask so as to complete an SOI transistor.

Figures 5, 6:
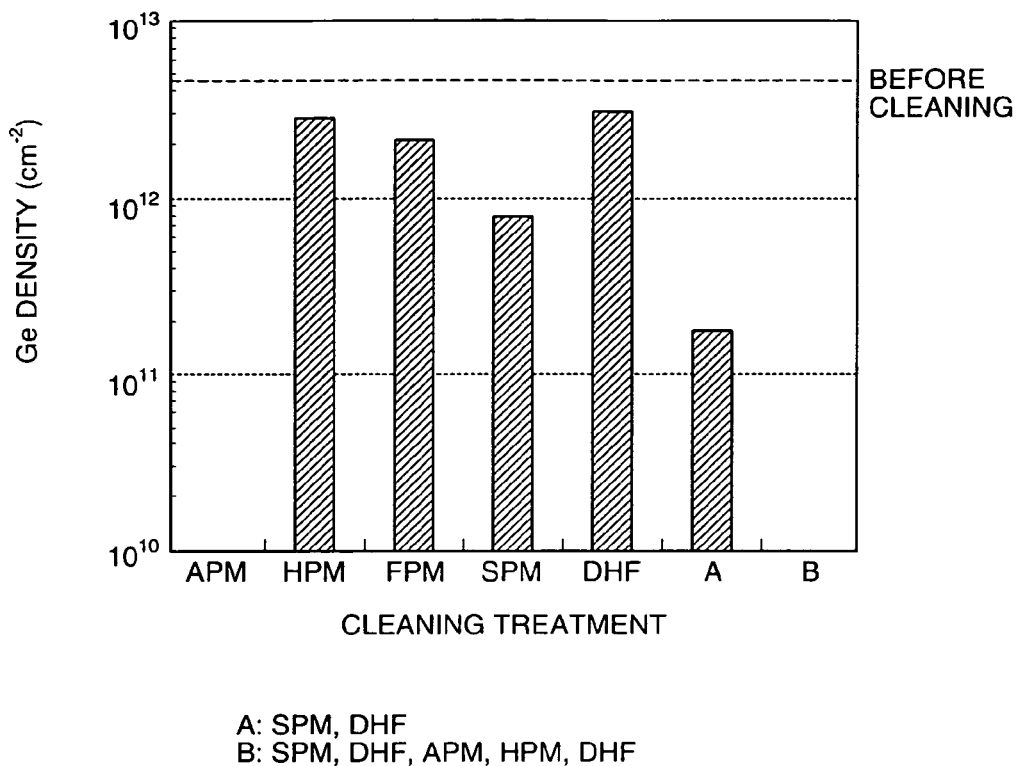
FIG. 5 is a chart showing results of a verification experiment.
FIG. 6 is a table showing mixing ratios and temperatures of cleaning solutions.
Figure 7:
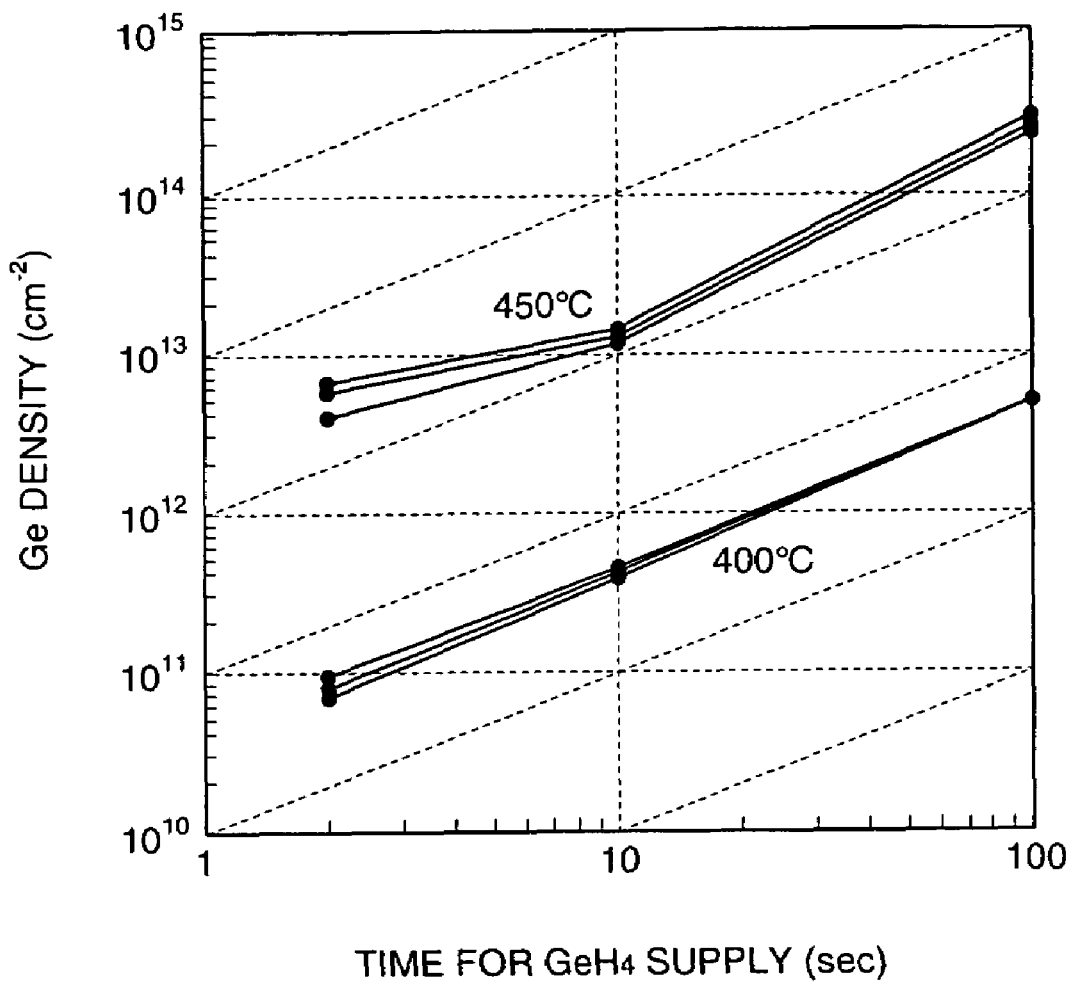
FIG. 7 is a chart showing experimental results related to a problem addressed herein.
Figure 8:
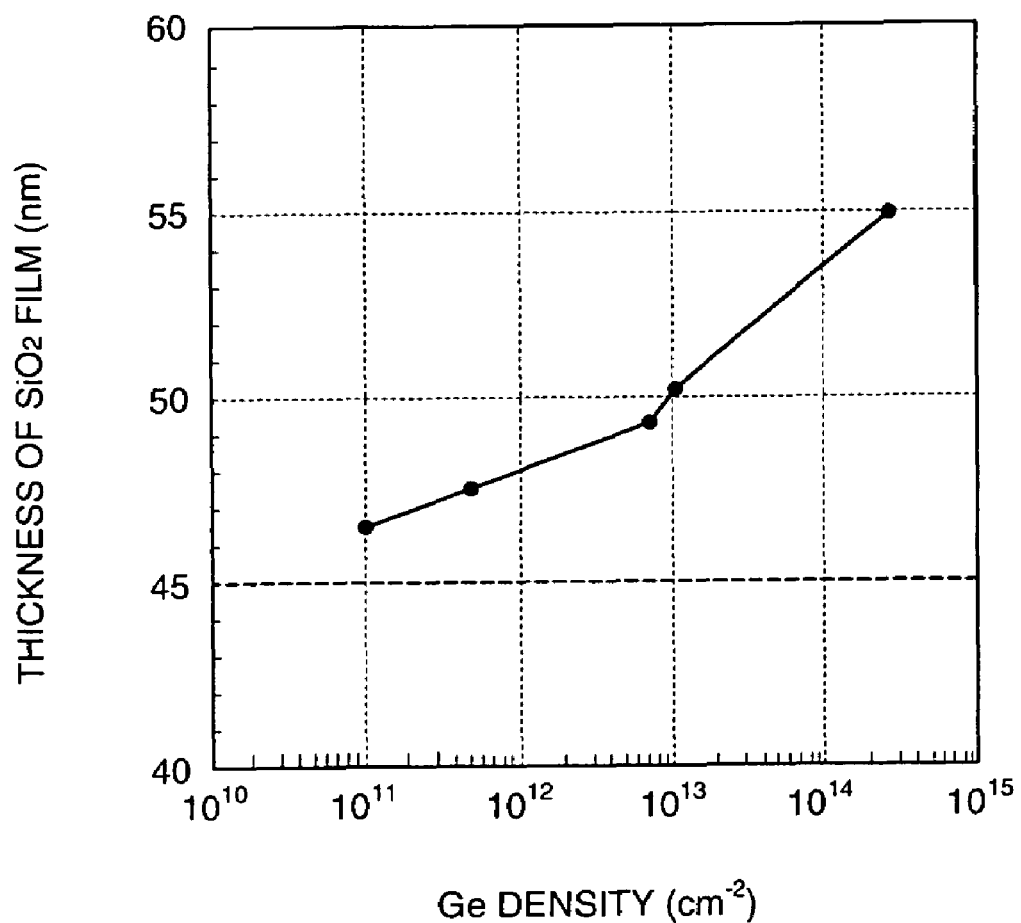
FIG. 8 is a chart showing experimental results related to another problem addressed herein.
Figure 9:
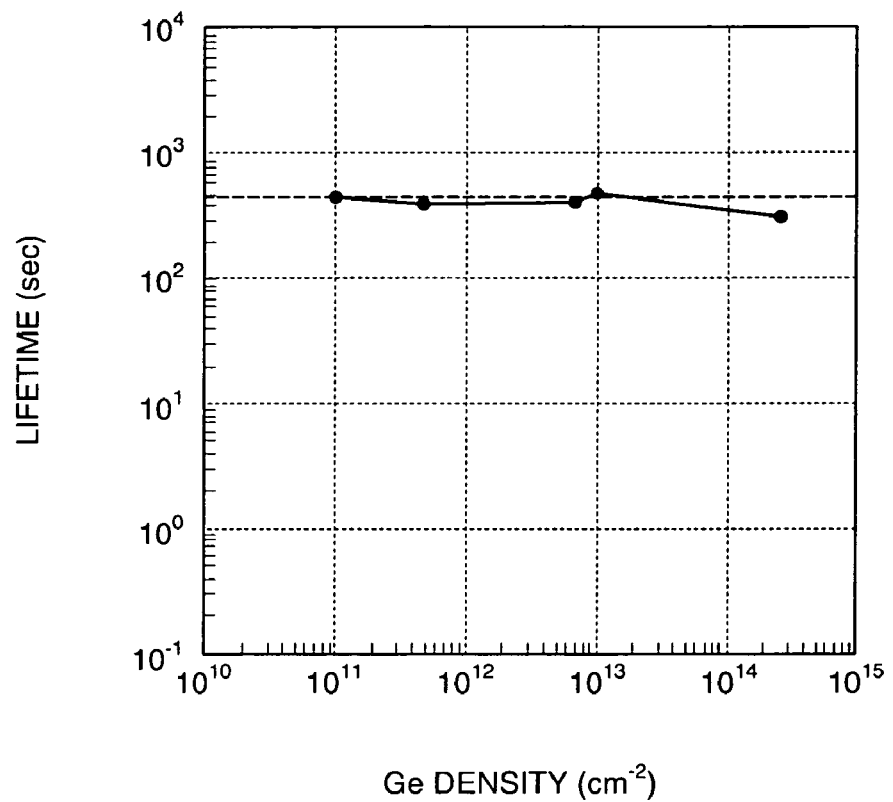
FIG. 9 is a chart showing experimental results related to still another problem addressed herein.
Figure 10:
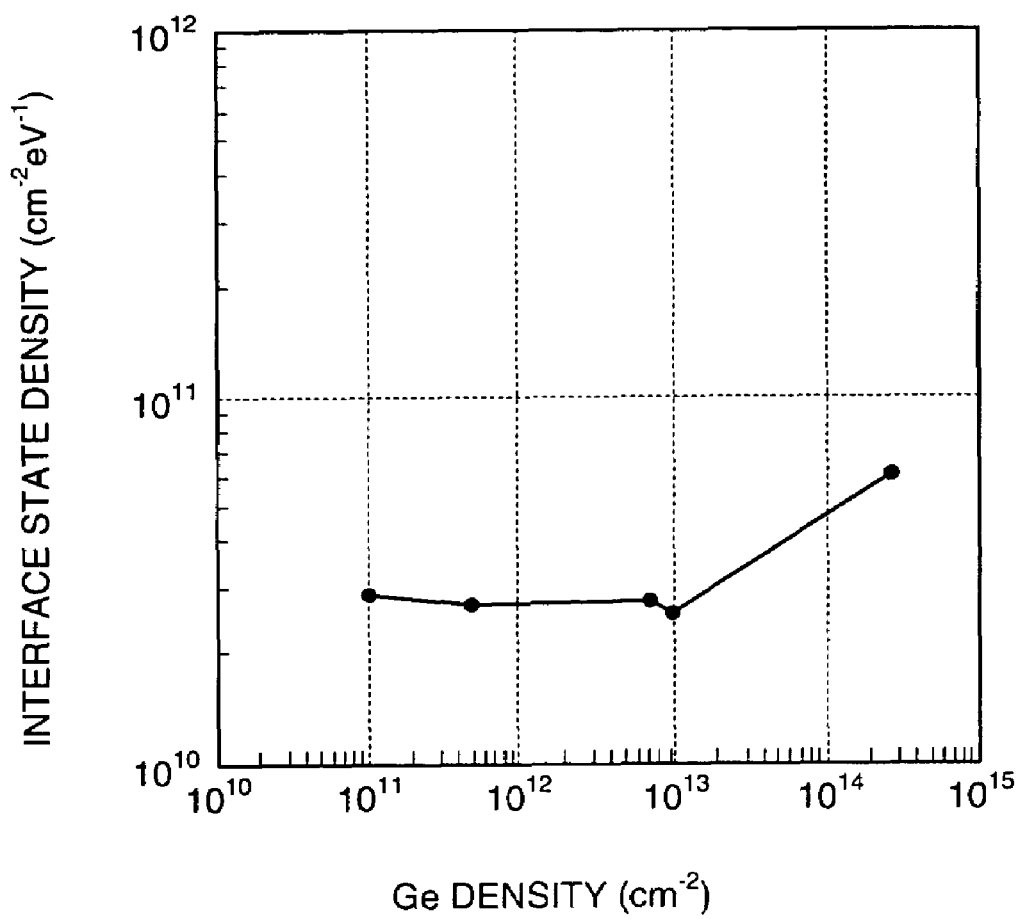
FIG. 10 is a chart showing experimental results related to yet another problem addressed herein.

FIG. 5 is a chart showing Ge density of the surface of Ge adsorbed wafers after cleaning treatment in a Ge removal experiment. The horizontal axis in FIG. 5 shows types of cleaning treatment performed to the Ge adsorbed wafers. The vertical axis in FIG. 5 shows amounts of Ge adsorption (Ge density) remaining after the cleaning treatment. In addition, the dotted line in FIG. 5 shows Ge density on the surface of the Ge adsorbed wafer before cleaning treatment. The cleaning treatment A stated in FIG. 5 is sequential treatment in which SPM and DHF are performed in order. The cleaning treatment B is sequential treatment in which SPM, DHF, APM, HPM, and DHF are performed in order.

As shown in FIG. 5, APM cleaning and the cleaning treatment B including APM cleaning were particularly effective for removing Ge adsorbing onto the surface of the wafer. The cleaning treatment reduced the Ge density on the surface of the wafer from $10^{12}$ cm$^{-2}$ to $10^{10}$ cm$^{-2}$ or less. The result of the experiment shows, in the state shown in FIG. 4A, that APM cleaning or the cleaning treatment B including APM cleaning to the Si substrate 1 can remove the Ge residue thoroughly from the cavity 21 through the opening faces.

FIG. 6 is a table showing detailed conditions of the cleaning treatment performed to Ge adsorbed wafers. As shown in FIG. 6, a solution of 31% $H_2O_2$, 30% $NH_4OH$, and $H_2O$ was used for APM cleaning in this verification experiment. The mixing ratio of this solution (i.e. an APM cleaning solution) was $H_2O_2:NH_4OH:H_2O=4:1:50$. Further, the temperature of the APM cleaning solution was controlled to keep 60 degrees centigrade. (In the embodiment above, the Si substrate 1 after the cavity 21 is formed is cleaned with the APM cleaning solution in such a mixing ratio and a temperature, for example.)

For HPM cleaning, a solution of 31% $H_2O_2$, 36% HCl, and $H_2O$ was used. The mixing ratio of this solution (i.e. an HPM cleaning solution) was $H_2O_2:HCl:H2O=1:1:50$. Further, the temperature of the HPM cleaning solution was controlled to keep 60 degrees centigrade.

For FPM cleaning, a solution of 31% $H_2O_2$, 50% HF, and $H_2O$ was used. The mixing ratio of this solution (i.e. an FPM cleaning solution) was $H_2O_2:HF:H_2O=1:1:200$. Further, the temperature of the FPM cleaning solution was controlled to keep 60 degrees centigrade.

For SPM cleaning, a solution of 97% $H_2SO_4$ and 31% $H_2O_2$ was used. The mixing ratio of this solution (i.e. an SPM cleaning solution) was $H_2SO_4:H_2O_2=4:1$. Further, the temperature of the SPM cleaning solution was controlled to keep 120 degrees centigrade.

For DHF cleaning, a solution of 50% HF and $H_2O$ was used. The mixing ratio of this solution (i.e. a DHF cleaning solution) is $HF:H_2O=1:200$. Since the DHF cleaning solution is not exothermic, temperature control was not applied particularly. (RT indicates that temperature control was not applied particularly.)

In FIG. 6, % indicates a weight percentage concentration.

According to the embodiment of the invention, the buried oxide film 31 is formed in the cavity 21 after the Ge residue is thoroughly removed from the cavity 21. Therefore, deterioration of device characteristics due to the Ge residue can be prevented. The deterioration here is, for example, an increase of a leakage current due to an increase of interface state at the $SiO_2/Si$ interface, deterioration of mobility, an increase of noise, and a decrease of a dielectric breakdown voltage. In addition, thorough removal of the Ge residue can prevent disadvantages such as that the buried oxide film 31 is formed thicker than that supposed to be. Thereby equalization of the thickness of the wafers (i.e. each Si layer 5) can be achieved. Therefore, according to the embodiment of the invention, a semiconductor device with favorable device characteristics can be provided.

In this embodiment, the Si substrate 1 corresponds to the above-described semiconductor base, and the SiGe layer 3 corresponds to the above-described first semiconductor layer. Further, the Si layer 5 corresponds to the above-described second semiconductor layer, and the $SiO_2$ film 11 corresponds to the above-described support member. The buried oxide film 31 corresponds to the above-described insulating film, and the Ge residue corresponds to the above-described residue of the first semiconductor layer.

In this embodiment, it is explained that the case where inside of the cavity 31 is cleaned with the APM cleaning solution after the cavity 31 is formed between the Si substrate 1 and the Si layer 5 by etching with hydrofluoric-nitric acid. However, the invention is not limited to this. For example, the cleaning treatment with the APM cleaning solution can be gradually started in the middle of the etching process with hydrofluoric-nitric acid, or the etching process and the cleaning treatment can be performed alternately. The structure like these can also prevent Ge from remaining in the cavity 21.

Although the case of APM cleaning inside of the cavity 31 is explained in the embodiment, the cleaning condition of the invention is not limited to APM cleaning. For example, the inside of the cavity 31 can be cleaned by the cleaning treatment B shown in FIG. 5. Combination of APM cleaning and any one of HPM cleaning, FPM cleaning, SPM cleaning, and DHF cleaning can thoroughly remove the Ge residue from the cavity 31.

Further, in the embodiment, the case to firstly form the SiGe layer 3 and the Si layer 5 sequentially on the whole surface of the Si substrate 1 by epitaxial growth is explained. However, these layers can be formed exclusively on the element-forming region instead of the whole surface of the Si substrate 1 in order not to be formed on the isolation region. For example, the SiGe layer 3 and the Si layer 5 can be formed alternately by selective epitaxial growth while the surface of the Si substrate 1 in the isolation region is covered with a $SiO_2$ film. Even with such a structure, the $SiO_2$ film 11 that is a support member can be formed on the Si substrate 1 to cover the Si layer 5, and the opening faces to expose a portion of the sides of the SiGe layer 3 can be formed in the $SiO_2$ film 11. Accordingly, the cavity 21 can be formed on the element-forming region.

Further, in this embodiment, the case where the semiconductor base is made of Si, the first semiconductor layer is made of SiGe, and the second semiconductor layer is made of Si is explained. However, their materials are not limited to the above. Note that the semiconductor base, for example, can be made of Si, Ge, SiGe, SiC, SiSn, PbS, GaAs, InP, GaP, GaN or ZnSe. The first semiconductor layer can be made of a material whose etching selective ratio is larger than those of the Si substrate and the second semiconductor layer. For example, the first semiconductor layer and the second semiconductor layer can be made of Si, Ge, SiGe, SiC, SiSn, PbS, GaAs, InP, GaP, GaN, ZnSe, or any combination thereof.

The entire disclosure of Japanese Patent application No. 2005-216873, filed Jul. 27, 2005 is expressly incorporated by reference herein.

What is claimed is:

1. A method for manufacturing a semiconductor substrate, comprising:

forming a first semiconductor layer on a region of a semiconductor base;

forming a second semiconductor layer having an etching rate smaller than an etching rate of the first semiconductor layer;

forming a support member to support the second semiconductor layer on the semiconductor base so as to cover the second semiconductor layer;

forming an opening face in the support member to expose an edge of the first semiconductor layer;

etching the first semiconductor layer through the opening face so as to form a cavity between the second semiconductor layer and the semiconductor base;

cleaning the cavity through the opening face in a condition to remove a residue formed during etching of the first semiconductor layer; and forming an insulating film in the cavity after the cleaning of the cavity, the first semiconductor layer being made of SiGe, a cleaning solution used for the cleaning of the cavity being an APM cleaning solution including an aqueous ammonia solution and a hydrogen peroxide solution, the cleaning of the cavity being carried out by a combination of a first cleaning step and a second cleaning step, the first cleaning step being carried out by using the APM cleaning solution, and the second cleaning step being carried out by using any one of an HPM cleaning solution, an FPM cleaning solution, a SPM cleaning solution and a DHF cleaning solution.

2. A method for manufacturing a semiconductor substrate, comprising:

forming a first semiconductor layer on a semiconductor base;

forming a second semiconductor layer having an etching rate smaller than an etching rate of the first semiconductor layer;

forming a hollow portion in the second semiconductor layer and the first semiconductor layer so as to expose the semiconductor base;

forming a support member to support the second semiconductor layer on the semiconductor base so as to embed the hollow portion and cover the second semiconductor layer;

forming an opening face in the support member to expose an edge of the first semiconductor layer;

etching the first semiconductor layer through the opening face so as to form a cavity between the second semiconductor layer and the semiconductor base;

cleaning the cavity through the opening face in a condition to remove a residue formed during etching of the first semiconductor layer; and forming an insulating film in the cavity after cleaning of the cavity the first semiconductor layer being made of SiGe, a cleaning solution used for the cleaning of the cavity being an APM cleaning solution including an aqueous ammonia solution and a hydrogen peroxide solution, the cleaning of the cavity being carried out by a combination of a first cleaning step and a second cleaning step, the first cleaning step being carried out by using the APM cleaning solution, and the second cleaning step being carried out by using any one of an HPM cleaning solution, an FPM cleaning solution, a SPM cleaning solution and a DHF cleaning solution.

3. The method for manufacturing a semiconductor substrate according to claim 1, further comprising:

planarizing a whole upper surface of the semiconductor base to remove the support member on the second semiconductor layer after the insulating film is formed in the cavity.

4. A method for manufacturing a semiconductor device, comprising:

forming a first semiconductor layer on a semiconductor base;

forming a second semiconductor layer having an etch rate smaller than an etch rate of the first semiconductor layer;

forming a support member to support the second semiconductor layer on the semiconductor base so as to cover the second semiconductor layer;

forming an opening face in the support member to expose a portion of an edge of the first semiconductor layer;

etching the first semiconductor layer through the opening face so as to form a cavity between the second semiconductor layer and the semiconductor base;

cleaning the cavity through the opening face in a condition to remove a residue formed during etching of the first semiconductor layer; and forming a transistor on the second semiconductor layer after the cleaning of the cavity, the transistor being formed after removing the support member on the second semiconductor layer, the first semiconductor layer being made of SiGe, a cleaning solution used for the cleaning of the cavity being an APM cleaning solution including an aqueous ammonia solution and a hydrogen peroxide solution, the cleaning of the cavity being carried out by a combination of a first cleaning step and a second cleaning step, the first cleaning step being carried out by using the APM cleaning solution, and the second cleaning step being carried out by using any one of an HPM cleaning solution, an FPM cleaning solution, a SPM cleaning solution and a DHF cleaning solution.

* * * * *